(12) United States Patent
Maxson et al.

(10) Patent No.: US 7,964,923 B2
(45) Date of Patent: Jun. 21, 2011

(54) STRUCTURE AND METHOD OF CREATING ENTIRELY SELF-ALIGNED METALLIC CONTACTS

(75) Inventors: Jeffery B. Maxson, New Windsor, NY (US); Cung Do Tran, Newburgh, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 569 days.

(21) Appl. No.: 11/970,165

(22) Filed: Jan. 7, 2008

(65) Prior Publication Data
US 2009/0174006 A1 Jul. 9, 2009

(51) Int. Cl.
*H01L 29/78* (2006.01)
(52) U.S. Cl. ........ 257/413; 257/377; 257/382; 257/384; 257/388; 257/E29.156
(58) Field of Classification Search .................. 257/377, 257/382, 384, 388, 412, 413, E29.156
See application file for complete search history.

(56) References Cited

U.S. PATENT DOCUMENTS

| | | | |
|---|---|---|---|
| 5,670,812 A | 9/1997 | Adler et al. | |
| 5,675,185 A | 10/1997 | Chen et al. | |
| 5,744,384 A | 4/1998 | Adler et al. | |
| 5,757,050 A | 5/1998 | Adler et al. | |
| 5,976,975 A * | 11/1999 | Joshi et al. | 438/672 |
| 6,022,766 A | 2/2000 | Chen et al. | |
| 6,627,502 B1 | 9/2003 | Cho | |
| 6,713,791 B2 | 3/2004 | Hsu et al. | |
| 6,908,850 B2 | 6/2005 | Doris et al. | |
| 6,930,030 B2 | 8/2005 | Rausch et al. | |
| 6,939,751 B2 | 9/2005 | Zhu et al. | |
| 7,098,536 B2 | 8/2006 | Yang et al. | |
| 7,105,440 B2 | 9/2006 | Luo et al. | |
| 7,135,724 B2 | 11/2006 | Chen et al. | |
| 2002/0100918 A1 | 8/2002 | Hsu et al. | |

(Continued)

OTHER PUBLICATIONS

Pan, J. et al. "Novel approach to Reduce Source/drain Series Resistance in High Performance CMOS Devices Using Self-Aligned CoWP Process for 45 nm UTSOI Transistors with 20 nm Gate Lengths", VLSI 2006.

(Continued)

*Primary Examiner* — Tan N Tran
(74) *Attorney, Agent, or Firm* — Scully, Scott, Murphy & Presser, P.C.; Yuanmin Cai (57) ABSTRACT

The semiconductor structure is provided that has entirely self-aligned metallic contacts. The semiconductor structure includes at least one field effect transistor located on a surface of a semiconductor substrate. The at least one field effect transistor includes a gate conductor stack comprising a lower layer of polysilicon and an upper layer of a first metal semiconductor alloy, the gate conductor stack having sidewalls that include at least one spacer. The structure further includes a second metal semiconductor alloy layer located within the semiconductor substrate at a footprint of the at least one spacer. The structure also includes a first metallic contact comprising a metal from Group VIII or IB of the Periodic Table of Elements and at least one of W, B, P, Mo and Re located on, and self-aligned to the first metal semiconductor alloy layer and a second metallic contact comprising a metal from Group VIII or IB of the Periodic Table of Elements and at least one of W, B, P, Mo and Re located on, and self-aligned to the second metal semiconductor alloy layer.

9 Claims, 7 Drawing Sheets

U.S. PATENT DOCUMENTS

| | | |
|---|---|---|
| 2004/0248348 A1 | 12/2004 | Rausch et al. |
| 2005/0054169 A1 | 3/2005 | Wagner et al. |
| 2005/0055494 A1 | 3/2005 | Doris et al. |
| 2005/0090066 A1 | 4/2005 | Zhu et al. |
| 2005/0093030 A1 | 5/2005 | Doris et al. |
| 2005/0158937 A1 | 7/2005 | Yang et al. |
| 2005/0263825 A1 | 12/2005 | Frohberg et al. |
| 2006/0065914 A1 | 3/2006 | Chen et al. |
| 2006/0091471 A1 | 5/2006 | Frohberg et al. |
| 2006/0099793 A1 | 5/2006 | Yang et al. |
| 2006/0148215 A1 | 7/2006 | Zhu et al. |
| 2006/0154413 A1 | 7/2006 | Luo et al. |
| 2006/0163670 A1 | 7/2006 | Ellis-Monaghan et al. |
| 2006/0172500 A1 | 8/2006 | Yang et al. |
| 2006/0199326 A1 | 9/2006 | Zhu et al. |
| 2006/0261477 A1 | 11/2006 | Yang et al. |
| 2006/0292779 A1 | 12/2006 | Chen et al. |
| 2007/0018202 A1 | 1/2007 | Zhu |
| 2007/0018252 A1 | 1/2007 | Zhu |
| 2007/0284654 A1* | 12/2007 | Rubino et al. ................ 257/327 |
| 2008/0169510 A1 | 7/2008 | Kumar et al. |
| 2009/0017625 A1 | 1/2009 | Lee et al. |
| 2009/0108378 A1* | 4/2009 | Zhu et al. ...................... 257/412 |

* cited by examiner

STRUCTURE AND METHOD OF CREATING ENTIRELY SELF-ALIGNED METALLIC CONTACTS

RELATED APPLICATIONS

This application is related to co-pending and co-assigned U.S. patent application Ser. No. 11/925,168 filed Oct. 26, 2007.

FIELD OF THE INVENTION

The present invention relates to a semiconductor structure and a method of fabricating the same. More particularly, the present invention relates to a semiconductor structure having entirely self-aligned metallic contacts and a method of fabricating the same.

BACKGROUND OF THE INVENTION

Field effect transistors (FETs) are the basic building block of today's integrated circuits. Such transistors can be formed in conventional bulk substrates (such as silicon) or in semiconductor-on-insulator (SOI) substrates.

State of the art metal oxide semiconductor (MOS) transistors are fabricated by depositing a gate stack material over a gate dielectric and a substrate. Generally, the MOS transistor fabrication process implements lithography and etching processes to define the conductive, e.g., poly-Si, gate structures. The gate structure and substrate are thermally oxidized, and, after this, source/drain extensions are formed by implantation. Sometimes the implant is performed using a spacer to create a specific distance between the gate and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. The deep source/drain implants are then performed with the thick spacer present. High temperature anneals are performed to activate the junctions after which the source/drain and top portion of the gate are generally silicided. Silicide formation typically requires that a refractory metal be deposited on a Si-containing substrate followed by a process to produce the silicide material. The silicide process forms low resistivity contacts to the deep source/drain regions and, optionally, the gate conductor.

High integration density can reduce manufacturing costs. In order to be able to make integrated circuits (ICs), such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device and yield degrading effects.

With continuing scaling down of the transistor size, it is required that the size of the via contacts also decreases. It is, however, difficult to etch contact vias and to avoid gate-to-via shorts when the size of the via opening is small and spacing between gates and vias is small. The gate-to-via shorts reduce chip yields and then increase the costs for IC manufacturing.

Moreover, and in the prior art, high contact resistive metal liners such as, for example, TiN, are employed in forming metal via contacts. The presence of metal liners in the contact vias is undesirable since the presence of the metal liner in the contact via decreases the device performance by increasing the resistance within the contact electrical path.

In view of the above, there is a need for providing a semiconductor structure that has improved device performance without increasing the size of the contact vias and without the need for having a highly resistive metal liner present within the via.

SUMMARY OF THE INVENTION

The present invention provides a semiconductor structure including entirely self-aligned metallic contacts and a method of fabricating the same. In the inventive structure, some of the metallic contacts are self-aligned to the gate conductor, while other metallic contacts are self-aligned to the source/drain diffusion regions. The inventive structure provides a large contact area to metal semiconductor alloy layers that are formed atop the gate conductor as well as the source/drain diffusion regions. The large contact area, in turn, reduces contact resistance and hence increases device performance of the inventive structure.

In some embodiments, the inventive structure is provided without the need of contact lithography and no contact etching step is required. Moreover, no highly resistive metal liner is present in the metallic contact vias of the present invention.

In general terms, the inventive semiconductor structure comprises:

at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer;

a second metal semiconductor alloy layer located within said semiconductor substrate at a footprint of said at least one spacer;

a first metallic contact comprising a metal from Group VIII or IB of the Periodic Table of Elements and at least one of W, B, P, Mo and Re located on, and self-aligned to said first metal semiconductor alloy layer; and a second first metallic contact comprising a metal from Group VIII or IB of the Periodic Table of Elements and at least one of W, B, P, Mo and Re located on, and self-aligned to said second metal semiconductor alloy layer.

In the present invention, the first and second metal semiconductor alloy layers may comprise the same material or a different material. In the present invention, the second metal semiconductor alloy layer is located within a source diffusion region and a drain diffusion region of the at least one transistor. Also, the first and second metallic contacts may comprise the same or different, preferably the same, compositional material.

In a further embodiment of the present invention, the first and second metallic contacts comprise CoW, CoP or CoWP, with CoWP being highly preferred.

In another embodiment of the present invention, a trench isolation region is located within the semiconductor substrate, wherein an outer edge of the trench isolation region is in contact with an edge of the second metal semiconductor alloy layer.

In still a further embodiment, a diffusion barrier is located on a surface of said trench isolation region, and a middle-of-the-line (MOL) dielectric is located on said diffusion barrier. In some embodiments, the MOL dielectric and the diffusion barrier have upper surfaces that are coplanar with upper surfaces of the first and second metallic contacts and the at least one spacer.

In yet other embodiments, the diffusion barrier is located only between the trench isolation region and the MOL dielectric and thus the diffusion barrier does not have an upper surface that is coplanar with the upper surfaces of the MOL dielectric, the first and second metallic contacts and the at least one spacer.

In another embodiment of the present invention, a gate dielectric material is present between the gate conductor stack and the substrate.

In addition to the above, the present invention also provides a method of fabricating the inventive structure mentioned above. In general terms, the method of the present invention comprises:

providing a patterned material stack comprising a lower layer of polysilicon and an upper layer of polysilicon germanium on a surface of a semiconductor substrate, said patterned material stack having sidewalls that are covered by at least one spacer;

removing said upper layer of polysilicon germanium from said patterned material stack;

forming a first metal semiconductor alloy layer within said polysilicon layer and forming a second metal semiconductor alloy layer within said semiconductor substrate at a footprint of said at least one spacer;

forming a first metallic contact comprising a metal from Group VIII or IB of the Periodic Table of Elements and at least one of W, B, P, Mo and Re on, and self-aligned to said first metal semiconductor alloy layer; and forming a second first metallic contact comprising a metal from Group VIII or IB of the Periodic Table of Elements and at least one of W, B, P, Mo and Re on, and self-aligned to said second metal semiconductor alloy layer, wherein said forming said first and second metallic contacts are performed simultaneously or in separate steps.

In a highly preferred embodiment, the forming of the first and second metallic contact is performed simultaneously. Typically, the metallic contacts are formed by a non-epitaxial raised/source drain approach comprising an electroless deposition of at least one metal from Group VIII or IB of the Periodic Table and at least one of B, P, Mo and Re. In some embodiments, the electroless deposition further comprises a palladium seed layer.

In a first embodiment of the inventive method, the method further includes forming a diffusion barrier and middle-of-the-line dielectric (MOL) after forming said first and second metallic contacts, and then planarizing the resultant structure to obtain a structure in which the diffusion barrier, the MOL dielectric, the first metallic contact, the second metallic contact and the at least one spacer each have an upper surface that is coplanar with each other.

In a second embodiment of the inventive method, the method further comprises forming a patterned diffusion barrier and a patterned MOL dielectric on a surface of a trench isolation region within said substrate, after forming said first and second metal semiconductor alloys, yet prior to forming said first and second metallic contacts. The patterned diffusion barrier and the patterned MOL dielectric are formed by deposition, lithography and etching. In the second embodiment, the diffusion barrier is positioned between the MOL dielectric and the trench isolation region and, in the resultant structure, the diffusion barrier does not have an upper surface that is coplanar with the MOL dielectric, the first and second metallic contacts and the at least one spacer.

DETAILED DESCRIPTION OF THE INVENTION

The present invention, which provides a semiconductor structure having entirely self-aligned metallic contacts (i.e., metal via contacts) and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Before discussing the invention in detail, it is noted that in the drawings that accompany the present invention two views are sometimes shown. In the cases where two views are shown, the drawing including the designation "A" is a view looking down on the structure, while the drawing including designation "B" is a cross sectional view through cut A-A shown in the top down view.

Figure 1A:
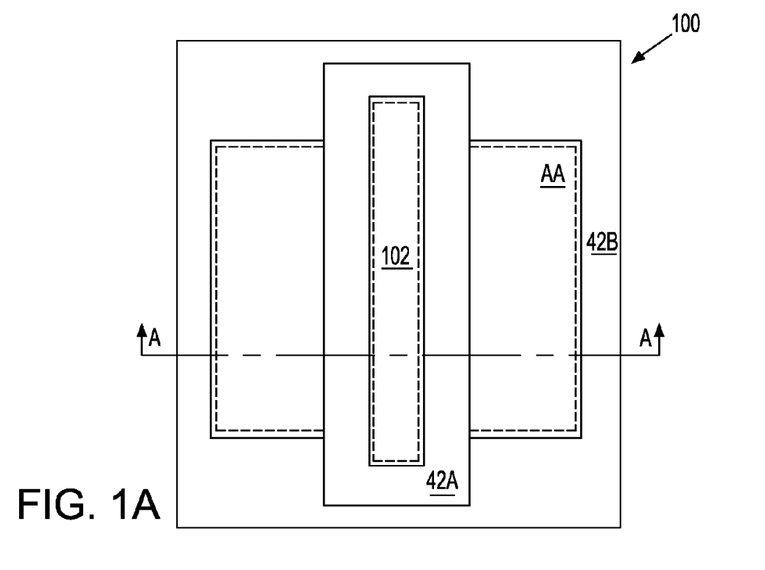
FIGS. 1A and 1B are pictorial representations (through a top-down view and a cross sectional view through cut A-A) of the inventive structure.
Figure 1B:
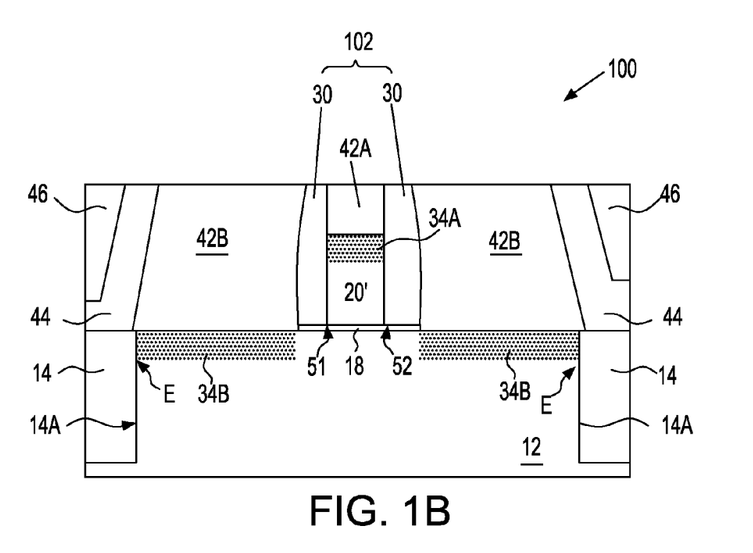
Figure 13:
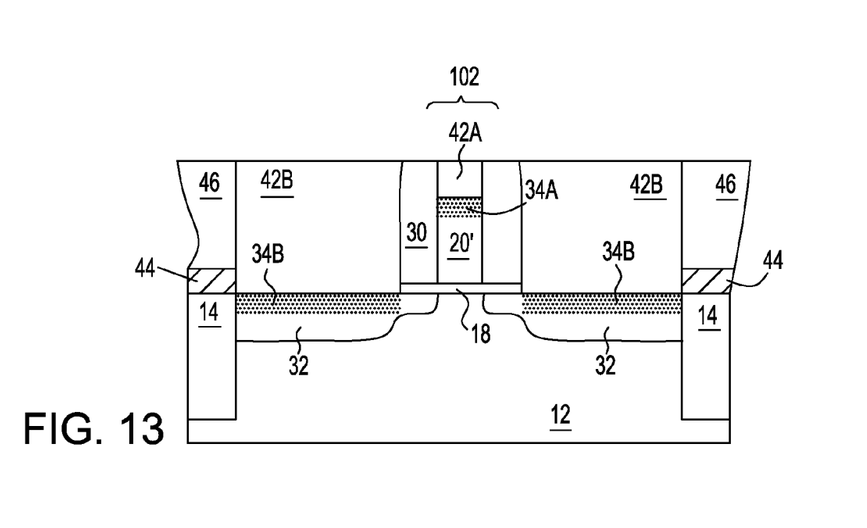

As stated above, and as is shown in FIGS. 1A-1B and FIG. 13, the present invention provides a semiconductor structure 100 that includes at least one field effect transistor 102 located on a surface of a semiconductor substrate 12 in the active area AA. The at least one field effect transistor 102 includes a gate conductor stack comprising a lower layer of polysilicon 20' and an upper layer of a first metal semiconductor alloy 34A. The gate conductor stack has sidewalls S1 and S2 that include at least one spacer 30.

The inventive structure further includes a second metal semiconductor alloy layer 34B located within the semiconductor substrate 12 at a footprint of said at least one spacer 30. A first metallic contact 42 comprising a metal from Group VIII or IB of the Periodic Table of Elements and at least one of W, B, P, Mo and Re is located on, and self-aligned to the first metal semiconductor alloy 34A, while a second metallic contact 42B comprising a metal from Group VIII or IB of the Periodic Table of Elements and at least one of W, B, P, Mo and Re is located on, and self-aligned to the second metal semiconductor alloy layer 34B. The first and second metallic contacts may comprise the same or different compositional material.

In the present invention, the first and second metal semiconductor alloy layers (34A and 34B, respectively) comprise the same or different material. The second metal semiconductor alloy layer 34B is located within a source diffusion region and a drain diffusion region (each labeled as 32 in the drawing) of the at least one transistor 102.

The semiconductor structure 100 further includes a barrier layer 44 located atop a trench isolation region 14 located within the semiconductor substrate 12. The barrier layer 44 is abutting outer edges of the metallic contact 42 located atop the second metal semiconductor alloy layer 34B. A middle-of-the-line (MOL) dielectric 46 is located within the structure.

In the inventive structure shown in FIGS. 1A-1B, the MOL dielectric 46, the barrier layer 44, the contact metals 42A and 42B and the at least one spacer 30 each having upper surfaces that are coplanar with each other.

In the inventive structure shown in FIG. 13, the MOL dielectric 46, the contact metals 42A and 42B and the at least one spacer 30 each have upper surfaces that are coplanar with each other; note that the barrier layer 44 is completely covered by MOL dielectric 46.

A trench isolation region 14, as mentioned above, is located within the semiconductor substrate 12, wherein an outer edge 14A of the trench isolation region 14 is in contact with an edge E of the second metal semiconductor alloy layer 34B.

As shown, a gate dielectric material 20 is present between the gate conductor stack and the semiconductor substrate 12.

Figure 2:
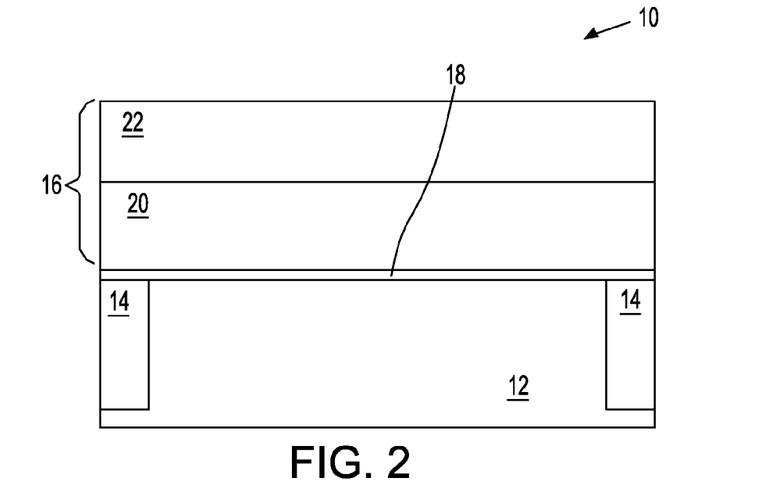
FIGS. 2-9 are pictorial representations (through cut A-A) depicting the basic processing steps that are employed in one embodiment of the present invention for fabricating the structure shown in FIGS. 1A and 1B.

Reference is now made to FIGS. 2-9, which are pictorial representations of the basic processing steps that are employed in accordance with a first embodiment of the present invention. In the first embodiment, the barrier layer, the MOL dielectric, the first metallic contact, the second metallic contact and the at least one spacer each have an upper surface that is coplanar with each other. Specifically, FIG. 2 illustrates an initial structure 10 that is employed in the present invention in fabricating the inventive structure shown in FIGS. 1A-1B. Specifically, the initial structure 10 includes a semiconductor substrate 12 having at least one trench isolation region 14 located therein. Atop the semiconductor substrate 12 there is present a material stack 16 that includes, from bottom to top, a gate dielectric 18, a layer of polysilicon (polySi) 20 and a layer of polySiGe 22.

The initial structure 10 shown in FIG. 2 is comprised of materials that are well known to those skilled in the art. Also, conventional techniques are used in forming the same. For example, the semiconductor substrate 12 comprises any semiconductor material including, for example, Si, Ge, SiGe, SiC, SiGeC, Ga, GaAs, InAs, InP and all other III/V or II/VI compound semiconductors. Semiconductor substrate 12 may be a layered semiconductor such as, for example, Si/SiGe, Si/SiGeC, or a semiconductor-on-insulator (SOI). When an SOI substrate is employed a buried insulating such as, for example, a buried oxide or a buried nitride is located between top and bottom semiconductor layers. The buried insulator may be continuous or it may discontinuous. In some embodiments of the present invention, the semiconductor substrate 12 is a Si-containing substrate, i.e., a semiconductor material that includes silicon. The semiconductor substrate 12 may be doped, undoped or contain regions and/or surfaces that are doped and other regions and/or surfaces that are undoped.

The semiconductor substrate 12 may be strained, unstrained or contain strained regions and unstrained regions therein. The semiconductor substrate 12 may have a single crystal orientation or it may be a hybrid orientation semiconductor substrate that has at least two surface regions that have different crystallographic orientations.

The at least one trench isolation 14 that is located within the semiconductor substrate 12 is formed utilizing a conventional process well known to those skilled in the art. Typically, the at least one trench isolation region 14 is formed by providing a patterned mask having at least one opening on the surface of the semiconductor substrate by deposition and lithography, etching is then used to etch a trench into the semiconductor substrate 12. The depth of the trench may vary and is not critical to the present invention. Next, the trench is filled with a trench dielectric material such as $SiO_2$ or TEOS (tetraethylorthosilicate) utilizing a deposition process. After filling of the trench, a planarization process such as, for example, chemical mechanical polishing (CMP) and/or grinding is employed to provide a planar structure. An optional trench liner can be formed within the trench prior to trench dielectric fill, and an optional densification step may also be performed.

Prior to forming the material stack 16, the surface of the semiconductor substrate 12 is cleaned to remove any residual layers (e.g., native oxides), foreign particles, and any residual metallic surface contamination and to temporarily protect the surface of the semiconductor substrate 12. Any residual silicon oxide is first removed in a solution of hydrofluoric acid. The preferred removal of particles and metallic contamination is based on the industry standard gate dielectric preclean known as RCA clean. The RCA clean includes a treatment in a solution of ammonium hydroxide ($NH_4OH$) and hydrogen peroxide ($H_2O_2$) followed by an aqueous mixture of hydrochloric acid and an oxidizing agent (e.g., $H_2O_2$, and $O_3$). As a result, the cleaned substrate surface is 'sealed' with a very thin layer of chemical oxide (not shown). While the chemical oxide is typically made thinner than about 10 Å so to not interfere with the properties of the gate dielectric 18, its thickness can be varied to beneficially alter properties of the gate dielectric 18.

A blanket layer of gate dielectric 18 is formed on the entire surface of the semiconductor substrate 12 including atop the isolation region 14. The gate dielectric 18 can be formed by a thermal growing process such as, for example, oxidation, nitridation or a combination thereof. Alternatively, the gate dielectric 18 can be formed by a deposition process such as, for example, chemical vapor deposition (CVD), plasma-enhanced chemical vapor deposition (PECVD), atomic layer or pulsed deposition (ALD or ALPD), evaporation, reactive sputtering, chemical solution deposition or other like deposition processes. The gate dielectric 18 may also be formed utilizing any combination of the above processes.

The gate dielectric 18 is comprised of an insulating material having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 18 employed in the present invention includes, but is not limited to: an oxide, nitride, oxynitride and/or silicates including metal silicates, aluminates, titanates and nitrides. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof.

The physical thickness of the gate dielectric 18 may vary, but typically, the gate dielectric 18 has a thickness from about 0.5 to about 10 nm, with a thickness from about 0.5 to about 2 nm being more typical.

After forming the gate dielectric 18, a blanket layer of polysilicon 20 is formed on the gate dielectric 18 utilizing a known deposition process such as, for example, physical vapor deposition, CVD, or evaporation. The thickness, i.e., height, of the layer of polysilicon 20 deposited at this point of the present invention may vary depending on the deposition process employed. Typically, the layer of polysilicon 20 has a thickness from about 20 to about 180 nm, with a thickness from about 50 to about 100 nm being more typical.

After forming the polysilicon layer 20 atop the gate dielectric 18, a layer of polysilicon germanium (polySiGe) 22 is formed on the polysilicon layer 20. The layer of polySiGe 22 can be formed in a separate deposition step from that used in forming the layer of polySi or the layer of polySiGe 22 can be formed in the same deposition step as that used in forming the layer of polysilicon by introducing Ge atoms into the deposition precursor stream. The thickness of the layer of polySiGe 22 may vary depending on the deposition technique used in forming the same. Typically, the layer of polySiGe 22 has a thickness from about 10 to about 100 nm, with a thickness from about 10 to about 50 nm being even more typical.

Figure 3:
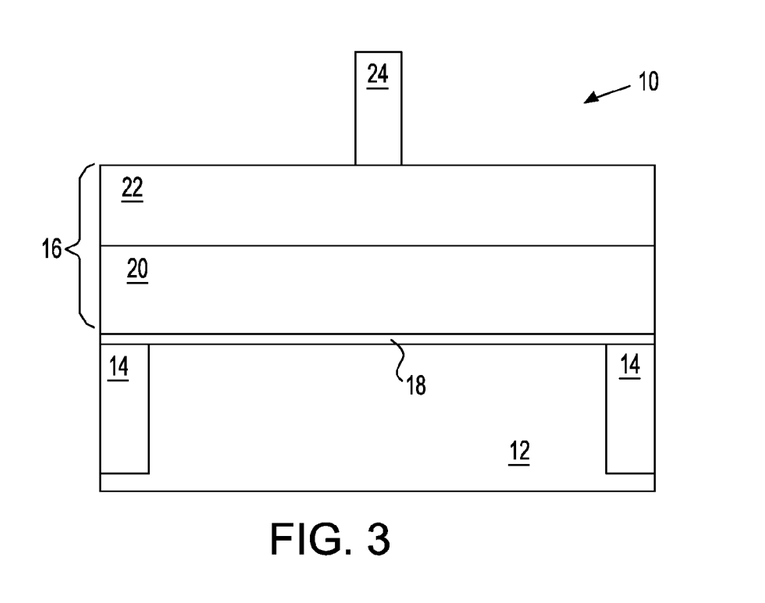

FIG. 3 illustrates the initial structure 10 shown in FIG. 2 including a patterned photoresist 24 located on a surface of the layer of polySiGe 22. The patterned photoresist 24 is formed by first depositing a resist material (not shown) on the entire surface of the layer of polySiGe 22. The resist material may be an organic resist material, an inorganic resist material or a hybrid resist material. After depositing the resist material onto the surface of the layer of polySiGe 22, the resist material is subjected to a lithographic process. The lithographic process includes exposing the resist material to a pattern of radiation and developing the exposed resist utilizing a conventional resist developer.

Figure 4:
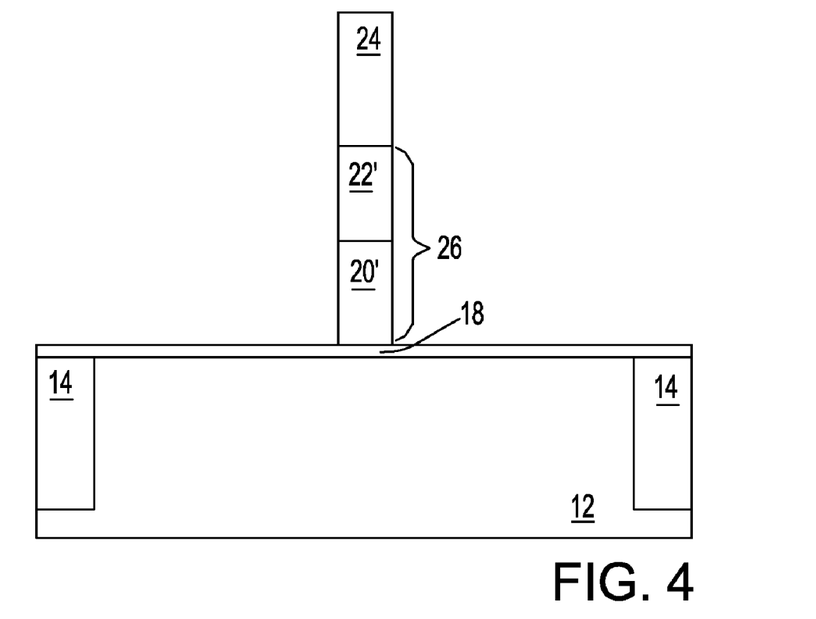

FIG. 4 illustrates the structure that is formed after performing an etching step that removes portions of the layer of polySiGe 22 and the layer of polySi 20 that are not protected by the patterned photoresist 24. The etching step includes dry etching (i.e., reactive ion etching, ion beam etching, plasma etching or laser ablation), chemical wet etching (i.e., an etching process that includes a chemical etchant) or a combination thereof. Typically, reactive ion etching is employed in forming the patterned structure shown in FIG. 4. It is noted that the etching step creates a patterned material stack 26 comprising a patterned layer of polySiGe 22' and a patterned layer of polySi 20'. It is also noted that the etching step typically stops on an upper surface of the gate dielectric 18.

In some embodiments, as shown in FIG. 4, a single patterned material stack 26 is formed. In other embodiments of the present invention, a plurality of such patterned material stacks can be formed utilizing a plurality of patterned photoresists and the etching step described above.

After forming the patterned material stack 26, the patterned photoresist 24 is removed from the structure utilizing a conventional resist stripping process such as, for example, ashing. Next, conventional CMOS processing steps are performed to provide the structure shown, for example, in FIG. 5. Specifically, source/drain extension regions (not specifically labeled) are formed utilizing a conventional extension ion implantation process. An optional anneal process may follow the extension ion implant. In some embodiments, a halo implant (not shown) can be formed at this point of the inventive process utilizing a conventional halo ion implantation process. In further embodiments of the present invention and prior to formation of the source/drain extension regions, a gate reoxidation process can be performed to provide a thin oxide (not shown) on the sidewalls of the patterned material stack 26.

Figure 5:
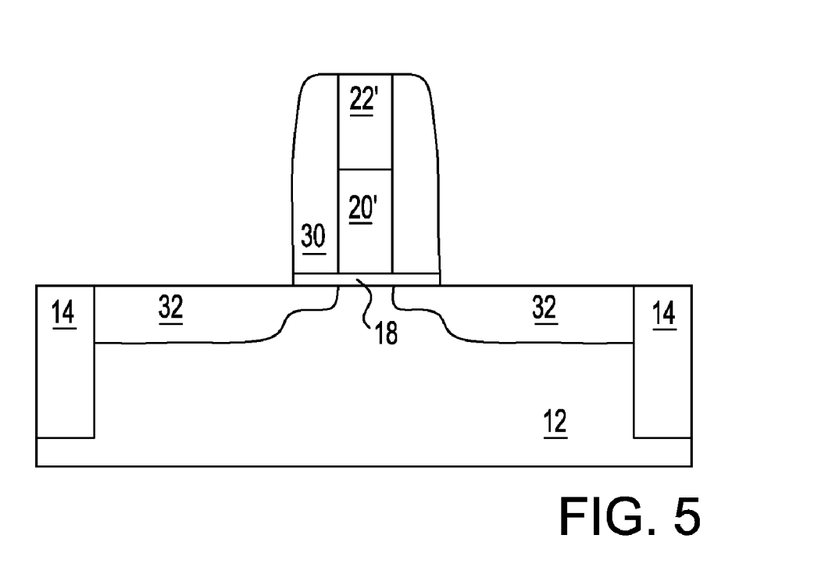

Next, at least one spacer 30 is formed by deposition and etching. The at least one spacer 30 comprises a dielectric material including, for example, an oxide, a nitride or an oxynitride. Typically, the at least one spacer 30 comprises an oxide of silicon and/or a nitride of silicon. The at least one spacer 30 must be sufficiently wide enough such that the source and drain metal semiconductor alloy layer (to be subsequently formed) does not encroach underneath the edges of the patterned material stack 26. Typically, the source/drain metal semiconductor alloy layers do not encroach underneath the edges of the material stack 26 when the at least one spacer 30 has a width, as measured at the bottom, from about 15 to about 200 nm. It is noted that during the spacer etch, exposed portions of the gate dielectric 18 are also removed.

After the at least one spacer 30 formation, source/drain diffusion regions 32 are formed into the semiconductor substrate 12; the source/drain diffusion regions 32 include the S/D extension regions mentioned above. The source/drain diffusion regions 32 are formed utilizing ion implantation and an annealing step. The annealing step serves to activate the dopants that were implanted by the previous implant step (or steps if annealing was not previously been performed to activate the dopants within the extension implant regions). At this point of the present invention, a buffer implant may be performed to provide the source/drain regions with a graded junction that optimizes the series resistance of the device. If not previously performed, the gate dielectric 18 can be etched utilizing the at least one spacer 30, the patterned layer of polysilicon 20' and the patterned layer of polySiGe 22' as an etch mask.

Figure 6:
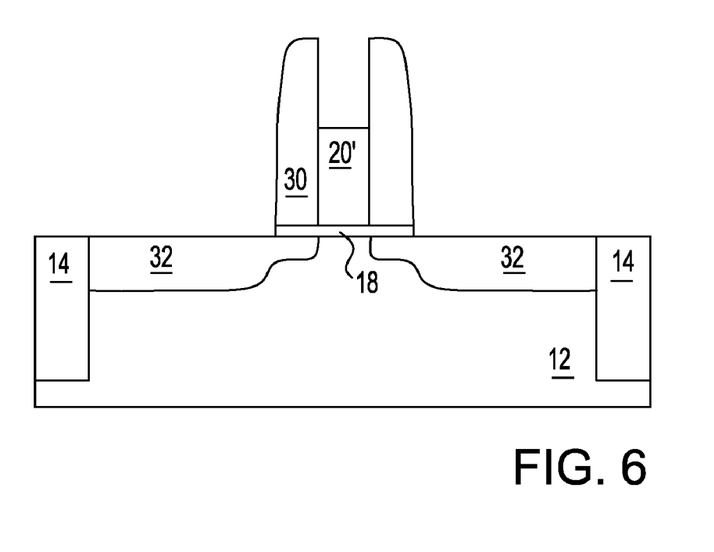

Next, the patterned layer of polySiGe 22' is etched selective to the patterned layer of polySi 20' to provide the structure shown, for example, in FIG. 6. The selective etch comprises any RIE or wet etching process that can remove SiGe selective to Si. An example of such a selective RIE process is any $C_xF_y$ gas such as, for example, $CF_4$ or $CHF_3$. Note that after the selective etching process has been performed, the patterned layer of polySi 20' is exposed.

Figure 7:
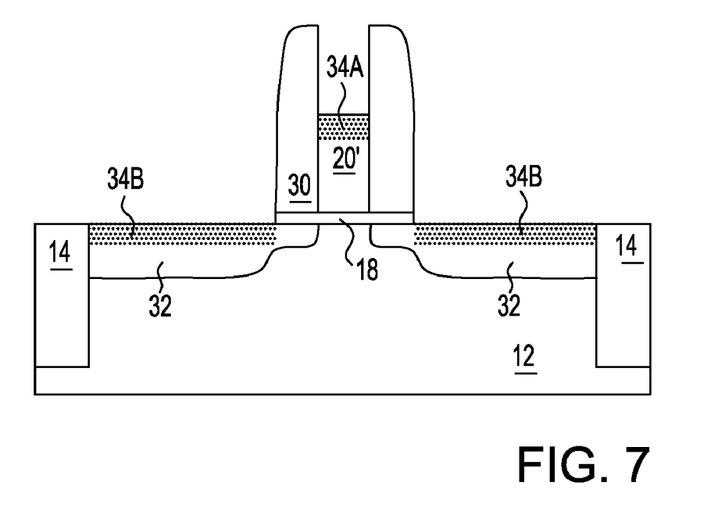

FIG. 7 illustrates the structure that is formed after formation of a first metal semiconductor alloy layer 34A atop of the surface of the patterned layer of polysilicon 20' and a second metal semiconductor alloy 34B within the source/drain diffusion regions 32. It is emphasized that the first metal semiconductor alloy 34A and the patterned layer of polysilicon 20' form a gate conductor stack of the inventive structure.

The first metal semiconductor alloy layer 34A and the second metal semiconductor alloy 34B are comprised of the same or different metal semiconductor alloy. When the first and second semiconductor alloy layers are comprised of the same material, a metal that is capable of thermally reacting with a semiconductor material is deposited atop the structure shown in FIG. 6. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary. Typically, and for applications in FETs, the metal that is deposited has a thickness from about 5 to about 15 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Typically, the anneal is a rapid thermal anneal in which the anneal time is about typically less than a minute. Following the final anneal step, any unreacted metal is removed from the structure.

When the first and second metal semiconductor alloy layers (34A and 34B) are comprised of different materials, a block mask is formed over one of the gate stack or the source/drain diffusion regions and then the above procedure is followed. Following formation of one of the metal semiconductor alloy layers, another block mask is formed over the region including the previous formed metal semiconductor alloy layer and the above procedure is also followed, but for the utilization of a different metal.

Metallic contacts are now formed. Specifically, a metallic contact is formed selectively atop the second metal semiconductor alloy layer 34B that is located atop the source/drain diffusion regions 32 as well as the first metal semiconductor alloy layer 34A located within the patterned polysilicon 20'. The metallic contact located atop the first metal semiconductor alloy layer 34A is referred to herein as a first metallic (or gate conductor) contact 42A, while the metallic contact located atop the second metal semiconductor alloy layer 34B is referred to as a second metallic (or source/drain) contact 42B. It is noted that the metallic contact 42B atop the second semiconductor metal alloy layer is self-aligned to the outer edge of the abutting spacer 30 and to the outer edge 14A of the trench isolation region 14, while the metallic contact 42A atop the first semiconductor alloy layer 34A is self-aligned to the inner edge of the at least one spacer 30. It is also noted that the second metallic contact is self-aligned to the underlying second metal semiconductor alloy layer which is located atop and self-aligned to the source/drain diffusion regions, while the first metallic contact is self-aligned to the gate conductor, i.e., the remaining polySi layer. The resultant structure including the metallic contacts (42A and 42B) is shown, for example, in FIG. 8.

Figure 8:
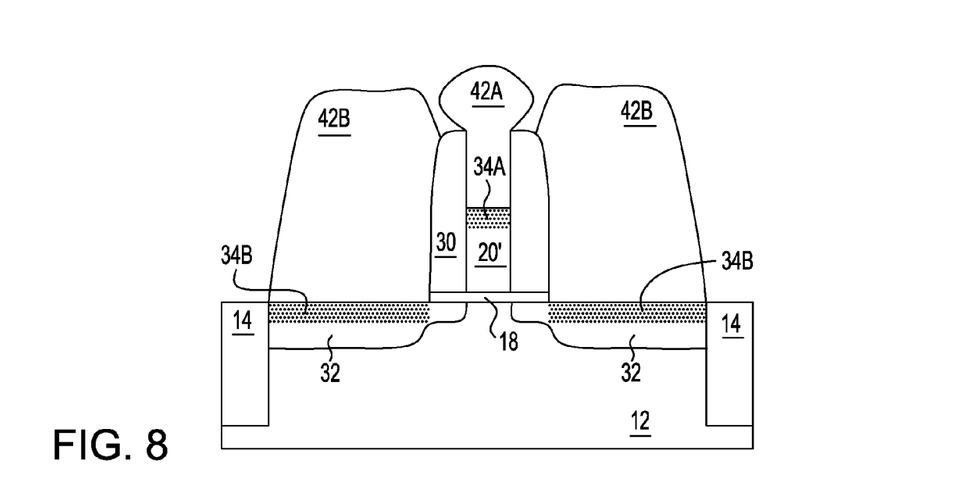

The first and second metallic contacts can be formed simultaneously or alternatively they can be formed separately utilizing block masks. It is further observed that if the first and second metallic contacts are formed separately, they may be formed in any order, i.e., first metallic contact and then second metallic contact or vice versa.

Each metallic contact comprises a metal from Group VIII or IB of the Periodic Table of Elements and at least one of W, B, P, Mo and Re. The metals from Group VIII include Fe, Ru, Os, Co, Rh, Ir, Ni, Pd and Pt, while the metals from Group IB include Cu, Ag and Au. Preferably, each metallic contact comprises CoW, CoP or CoWP, with CoWP being highly preferred.

Each metallic contact is formed utilizing a non-epitaxial raised source/drain approach that reduces the parasitic external resistance. Specifically, each metallic contact is formed by selective deposition utilizing an electroless deposition technique. In electroless depositions, a redox reaction involving the oxidation of one or more soluble reducing agent(s) and the reduction of one or more metallic ions occurs. For many metals including such as Co, the metal semiconductor alloy surface is sufficiently catalytic for the process to continue. To begin the process, however, the metal semiconductor alloy surface may, in some instances, be first seeded with a thin layer of catalytic material such as palladium to initiate the electroless deposition. More commonly, the surface is primed with a palladium ion containing solution. Palladium ion undergoes an immersion exchange reaction with the substrate leading to formation of a thin layer (1 to a few mono layer thick) of palladium. Background information on electroless plating is well documented in Industrial Electrochemistry—D. Pletcher and F. C. Walsh (Editor), $2^{nd}$ Edition, Chapman and Hall, NY 1990, and Electroless Plating: Fundamentals and Applications—G. O. Mallory, J. B. Hajdu (Editor) 1990. See, also, J. Pan et al. "Novel approach to Reduce Source/drain Series Resistance in High Performance CMOS Devices Using Self-Aligned CoWP Process for 45 nm Node UTSOI Transistors with 20 nm Gate Lengths", VLSI 2006. The contents of the J. Pan et al. article are incorporated herein by reference.

Figure 9:
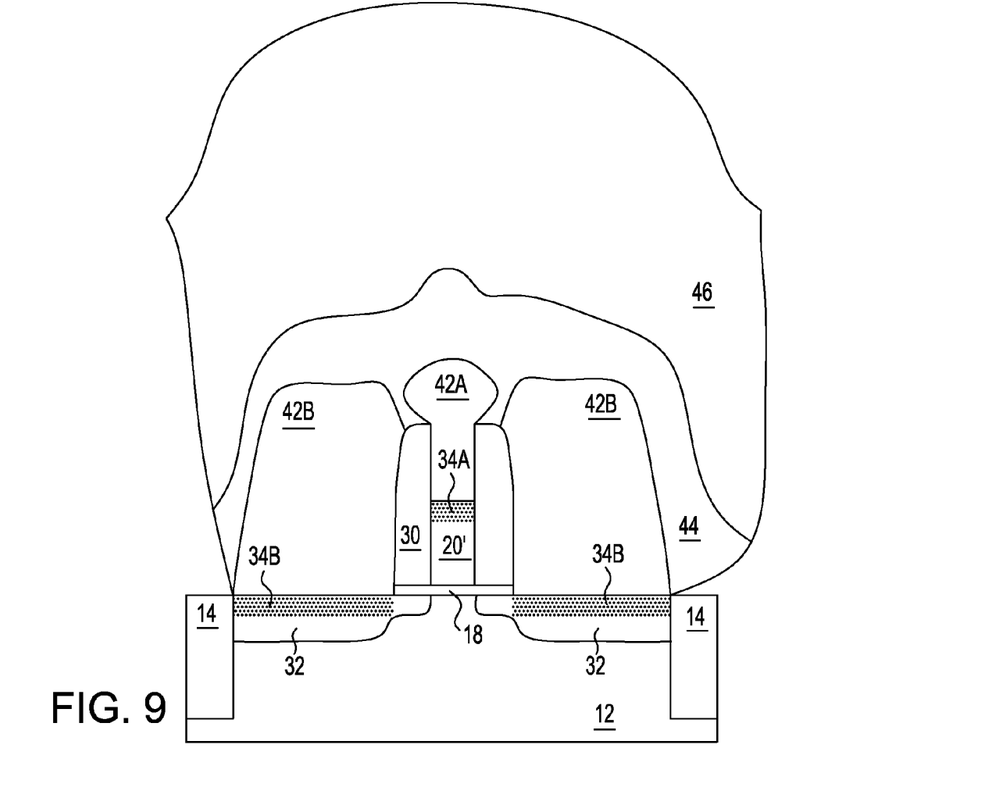

Next, a barrier layer 44 is deposited on the entire structure utilizing a conventional deposition process such as, for example, CVD, PECVD and PVD. The barrier layer 44 comprises a dielectric material such as a nitride, with a nitride of silicon being highly preferred. The barrier layer 44 may be a compressive stressed material, a tensile stressed material or a neutral (i.e., non)-stressed material. The barrier layer 44 has a thickness from about 10 to about 50 nm, with a thickness from about 15 to about 30 nm.

A middle-of-the-line (MOL) dielectric 46 is deposited on the barrier layer 44 and planarized. The MOL dielectric 46 may be undoped silicate glass (USG), fluorosilicate glass (FSG), borophosphosilicate glass (BPSG), a spin-on low-k dielectric layer, or a chemical vapor deposition (CVD) low-k dielectric layer. Other dielectrics such as oxides of silicon are also contemplated herein. The MOL dielectric 46 can be formed utilizing a conventional deposition process including, for example, CVD, PECVD, evaporation and spin-on coating. FIG. 9 illustrates the structure that is formed after formation of the barrier layer 44 and the MOL dielectric 46.

After forming the structure shown in FIG. 9, a planarization process such as, for example, chemical mechanical polishing and/or grinding is employed to provide the structure shown in FIGS. 1A-1B. It is noted that after planarization, the MOL dielectric 46, the barrier layer 44, the at least one spacer 30 and metallic contacts (42A and 42B) each have upper surfaces that are coplanar with each other. Following planarization, conventional back-end-of-the-line (BEOL) processing is performed making use of the metallic contacts (42A and 42B) as the contacts to the metal semiconductor alloy layers (34A and 34B), lying atop the gate conductor and the source/drain diffusion regions. The BEOL process forms an interconnect structure atop the structure which includes an interconnect dielectric having conductively filled openings that extend down to, and make contact with, the metallic contacts of the inventive structure.

Figure 10:
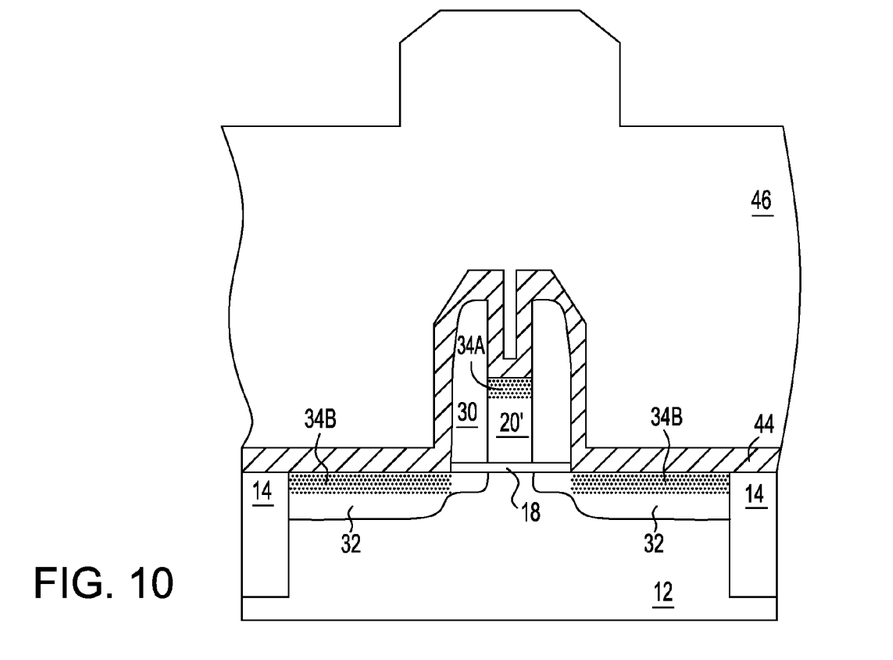
FIGS. 10-13 are pictorial representations (through cross sectional views) depicting the basic processing steps that are employed in another embodiment of the present invention; this embodiment provides an alternative structure to the structure shown in FIGS. 1A-1B.

Reference is now made to FIGS. 10-13 which illustrate processing steps in accordance with a second embodiment of the present invention which lead to the formation of an alternative structure of the present invention. The second embodiment begins by first providing the structure illustrated in FIG. 7 of the first embodiment. Next, and as shown in FIG. 10, a barrier layer 44 which serves as an etch stop layer in this embodiment of the present invention is formed as described above. The barrier layer 44 includes one of the materials mentioned above in the first embodiment, with a barrier layer of silicon nitride being highly preferred. After forming the barrier layer 44, a MOL dielectric 46 (see the description above) is then formed atop the barrier layer 44. It is noted that the MOL dielectric 46 may further comprise an oxide formed by deposition of tetraethylorthosilicate (TEOS).

A patterned photoresist (not shown) is then formed on the structure shown in FIG. 10 by conventional lithography. The patterned photoresist (not shown) includes an opening which exposes the active area of the structure (i.e., the area of the structure including the FET). Etching is then performed to remove exposed portions of the MOL dielectric 46 and the barrier layer 44 and thereafter the patterned photoresist is stripped utilizing a conventional stripping process well known in the art. The resultant structure that is formed after performing the above processing steps is shown, for example, in FIG. 11.

Figure 11:
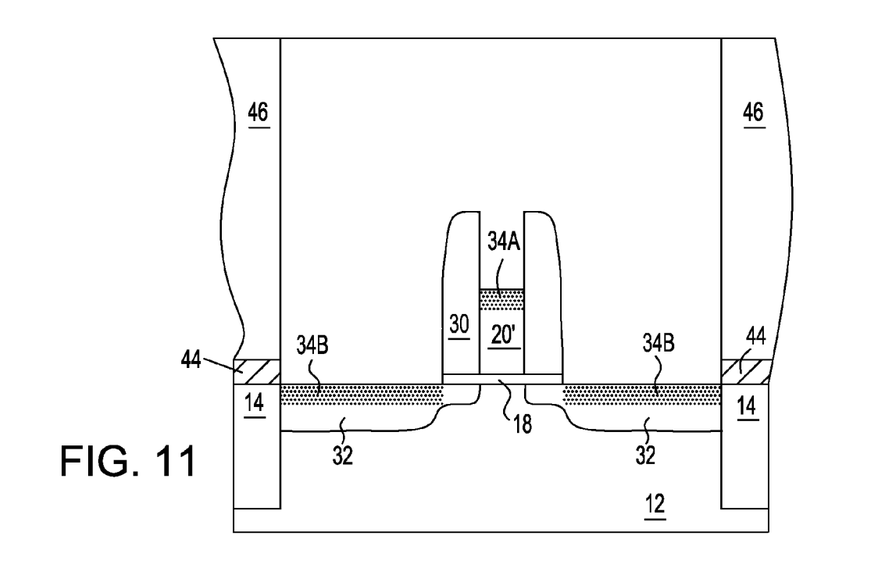
Figure 12:
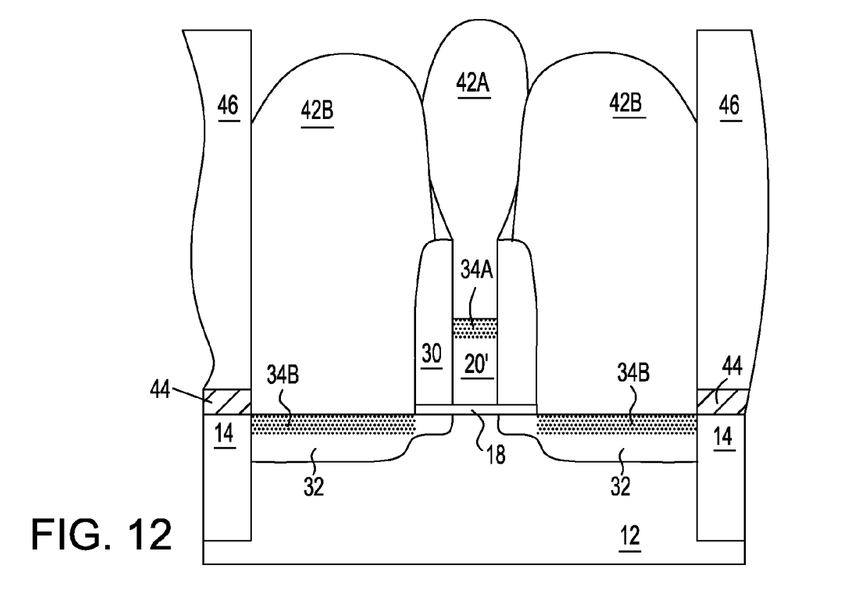

FIG. 12 illustrates the structure of FIG. 11 after forming the metallic contacts 42A and 42B. The metallic contacts 42A and 42B are formed utilizing the material and processing steps described above in the first embodiment of the present invention. Next, a planarization step is performed to provide the structure shown in FIG. 13. The structure shown in FIG. 13 is an alternative embodiment of the present invention and is similar to the one depicted in FIGS. 1A-1B above except that the barrier layer 44 does not have an upper surface that is coplanar with the MOL dielectric 46, the first and second metallic contacts 42A and 42B and the at least one spacer 30. Instead, the barrier layer 44 that remains is positioned between the trench isolation region 14 and the MOL dielectric 46. Note however, that a portion of the barrier layer 44 is still abutting the second metallic contact 42B located on the second metal semiconductor alloy layer 34B located atop the source/drain diffusion regions of the FET.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer;
    a second metal semiconductor alloy layer located within said semiconductor substrate at a footprint of said at least one spacer;
    a first metallic contact comprising a metal from Group VIII or IB of the Periodic Table of Elements and at least one of W, B, P, Mo and Re located on, and self-aligned to said first metal semiconductor alloy layer;
    a second metallic contact comprising a metal from Group VIII or IB of the Periodic Table of Elements and at least one of W, B, P, Mo and Re located on, and self-aligned to said second metal semiconductor alloy layer;
    a trench isolation region located within said semiconductor substrate, wherein an outer edge of said trench isolation region is in contact with an edge of said second metal semiconductor alloy layer; and
    a diffusion barrier located on a surface of said trench isolation region, and a middle-of-the-line (MOL) dielectric located on said diffusion barrier, wherein said MOL dielectric and said diffusion barrier have upper surfaces that are coplanar with upper surfaces of the first and second contacts and said at least one spacer.

2. The semiconductor structure of claim 1 wherein said second metal semiconductor alloy layer is located within a source diffusion region and a drain diffusion region of said at least one transistor.

3. The semiconductor structure of claim 1 wherein said first and second metallic contacts comprise CoW, CoP or CoWP.

4. The semiconductor structure of claim 1 wherein said first and second metal semiconductor alloys comprise a metal silicide.

5. The semiconductor structure of claim 1 further comprising a gate dielectric located between said lower layer of polysilicon and said semiconductor substrate.

6. A semiconductor structure comprising:
    at least one field effect transistor located on a surface of a semiconductor substrate, said at least one field effect transistor including a gate conductor stack comprising a lower layer of polysilicon and an upper layer of a first metal silicide, said gate conductor stack having sidewalls that include at least one spacer;
    a second metal silicide located within said semiconductor substrate at a footprint of said at least one spacer;
    a first CoWP metallic contact located on, and self-aligned to said first metal silicide;
    a second metallic CoWP metallic contact located on, and self-aligned to said second metal silicide;
    a trench isolation region located within said semiconductor substrate, wherein an outer edge of said trench isolation region is in contact with an edge of said second metal silicide; and
    a diffusion barrier located on a surface of said trench isolation region, and a middle-of-the-line (MOL) dielectric located on said diffusion barrier, wherein said MOL dielectric and said diffusion barrier have upper surfaces that are coplanar with upper surfaces of the first and second CoWP metallic contacts and said at least one spacer.

7. The semiconductor structure of claim 6 wherein said second metal silicide is located within a source diffusion region and a drain diffusion region of said at least one transistor.

8. The semiconductor structure of claim 6 further comprising a gate dielectric located between said lower layer of polysilicon and said semiconductor substrate.

9. A semiconductor structure comprising:

at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer;

a second metal semiconductor alloy layer located within said semiconductor substrate at a footprint of said at least one spacer;

a first metallic contact comprising a metal from Group VIII or IB of the Periodic Table of Elements and at least one of W, B, P, Mo and Re located on, and self-aligned to said first metal semiconductor alloy layer;

a second metallic contact comprising a metal from Group VIII or IB of the Periodic Table of Elements and at least one of W, B, P, Mo and Re located on, and self-aligned to said second metal semiconductor alloy layer;

a trench isolation region located within said semiconductor substrate, wherein an outer edge of said trench isolation region is in contact with an edge of said second metal semiconductor alloy layer; and a diffusion barrier located only on a surface of said trench isolation region, and a middle-of-the-line (MOL) dielectric located on said diffusion barrier, wherein said diffusion barrier has an edge that does not extend beyond said outer edge of said trench isolation region and thus said diffusion barrier has an upper surface that is non-coplanar with upper surfaces of the MOL dielectric, the first and second metallic contacts and the at least one spacer.

* * * * *